US009672300B2

(12) United States Patent
Mikami et al.

(10) Patent No.: US 9,672,300 B2
(45) Date of Patent: Jun. 6, 2017

(54) PATTERN GENERATION METHOD

(71) Applicant: CANON KABUSHIKI KAISHA, Tokyo (JP)

(72) Inventors: Koji Mikami, Nikko (JP); Tadashi Arai, Utsunomiya (JP); Hiroyuki Ishii, Shioya-gun (JP)

(73) Assignee: Canon Kabushiki Kaisha, Tokyo (JP)

( * ) Notice: Subject to any disclaimer, the term of this patent is extended or adjusted under 35 U.S.C. 154(b) by 456 days.

(21) Appl. No.: 13/908,773

(22) Filed: Jun. 3, 2013

(65) Prior Publication Data
US 2013/0329202 A1 Dec. 12, 2013

(30) Foreign Application Priority Data

Jun. 8, 2012 (JP) .................................. 2012-131117

(51) Int. Cl.
G06F 17/50 (2006.01)
G03F 1/36 (2012.01)
G03F 1/70 (2012.01)

(52) U.S. Cl.
CPC ............... *G06F 17/50* (2013.01); *G03F 1/36* (2013.01); *G03F 1/70* (2013.01)

(58) Field of Classification Search
USPC ........................................................ 716/55
See application file for complete search history.

(56) References Cited

U.S. PATENT DOCUMENTS

| 6,425,117 B1 | 7/2002 | Pasch | |
| 2009/0169832 A1* | 7/2009 | Aton | 428/195.1 |
| 2009/0199153 A1* | 8/2009 | Usui | G03F 7/705 716/55 |
| 2010/0237878 A1* | 9/2010 | Kanazawa | 324/551 |
| 2011/0161907 A1* | 6/2011 | Cheng | 716/119 |
| 2012/0100468 A1 | 4/2012 | Lee | |

FOREIGN PATENT DOCUMENTS

| CN | 101013271 A | 8/2007 |
| CN | 101192252 A | 6/2008 |
| CN | 102053503 A | 5/2011 |

(Continued)

OTHER PUBLICATIONS

Michael C. Smayling, "Low k1 Logic Design using Gridded Design Rules", Proc. of SPIE, 2008, 7 pages, vol. 6925, SPIE, Bellingham, Washington.

(Continued)

*Primary Examiner* — Bryce Aisaka
(74) *Attorney, Agent, or Firm* — Canon U.S.A., Inc. IP Division

(57) ABSTRACT

A pattern generation method for generating a pattern of a cell used to generate a pattern of a mask using a computer, includes obtaining data of pattern of the cell, calculating image of the pattern of the cell to obtain an evaluation value of the image by repeatedly changing a parameter value of an exposure condition when the mask which has the pattern of the cell is illuminated to project image of the pattern of the cell onto a substrate to expose the substrate, and a parameter value of the pattern of the cell, and determining parameter value of the pattern of the cell when the evaluation value satisfies a predetermined evaluation standard.

13 Claims, 12 Drawing Sheets

(56) References Cited

FOREIGN PATENT DOCUMENTS

| | | |
|---|---|---|
| CN | 102147567 A | 8/2011 |
| EP | 1450206 A2 | 8/2004 |
| JP | 3073156 B2 | 8/2000 |
| JP | 2004-079714 A | 3/2004 |
| JP | 3827659 | 9/2006 |
| JP | 2008-310228 A | 12/2008 |
| JP | 2010-117404 A | 5/2010 |
| JP | 2011095729 A | 5/2011 |
| JP | 2012-098397 A | 5/2012 |
| JP | 2012-099596 A | 5/2012 |
| TW | 200731001 A | 8/2007 |
| TW | I334961 B | 12/2010 |
| TW | I364064 B | 5/2012 |

OTHER PUBLICATIONS

Michael C. Smayling, "Sub-20nm Logic Lithography Optimization with Simple OPC and Multiple Pitch Division", Proc. of SPIE, 2012, 9 pages, vol. 8326, SPIE, Bellingham, Washington.

\* cited by examiner

FIG. 4

| TYPE OF PATTERN | | | | |
|---|---|---|---|---|
| A | B | C | D | E |
| F | G | H | I | J |
| K | L | M | N | O |

PATTERN GENERATION METHOD

BACKGROUND OF THE INVENTION

Field of the Invention

The present invention relates to a pattern generation method.

Description of the Related Art

An exposure apparatus is used in an exposure process of a manufacturing process of a semiconductor device. The exposure apparatus uses light from a light source to illuminate a mask (reticle) on which a circuit pattern of the semiconductor device using an illumination optical system is formed and transfers a pattern of mask onto a wafer using a projection optical system.

Recently, the miniaturization of patterns of the semiconductor devices has been further progressed, and in the exposure process, a Resolution Enhanced Technology such as an off-axis illumination of the illumination optical system or optical proximity correction (OPC) of a pattern of a mask has been used.

A pattern of an entire surface of the mask includes one or a plurality of patterns corresponding to an area of one semiconductor chip. A pattern of one semiconductor chip area is configured by combining circuit pattern groups including a block cell in which functional blocks are formed in one group, an IO unit indicating input/output of data, and a standard cell in the unit of logic element.

When the OPC is performed on the pattern of the mask of the entire semiconductor chip, the amount of correction data of the pattern is huge, which requires several days as a processing time. Therefore, a technique for performing the OPC on the standard cell (hereinafter, referred to as cell OPC) as a previous step of the OPC which is performed on the entire mask pattern has been studied.

As an example in which the OPC is applied to the standard cell, a technique for repeating operations of extracting one cell, applying the OPC to the cell, and registering the completed cell in a library for every cell is discussed (see Japanese Patent No. 3073156).

Further, it is discussed that the mask pattern is classified into a pattern to which the cell OPC is applied and a pattern in which the OPC (hereinafter, referred to as a chip level OPC) is applied to a pattern of the entire surface of the semiconductor chip (see Japanese Patent No. 3827659). Japanese Patent No. 3827659 discusses that the OPC is performed on a pattern for a cell OPC and the cell on which the OPC is performed is registered in a cell library. In addition, Japanese Patent No. 3827659 further discusses a technique for performing the OPC on a chip level OPC applied pattern to generate a mask pattern, after generating a pattern of the semiconductor chip by arranging cells selected from the cell library.

In the meantime, in order to deal with the miniaturization of the pattern, it has become difficult to satisfactorily transfer a desired pattern onto a wafer in a conventional two dimensional layout (extending in horizontal and vertical directions) pattern. Therefore, there is an action which uses an improved technique for a design called as design for manufacturability (DfM) which allows easy processing in a manufacturing process to prevent a hot spot which is detected in a subsequent process from occurring.

A method for producing a pattern in which a pitch restriction is added to the designed pattern which is called a one dimension gridded design rule (1D-GDR) (one dimensional layout) technique is studied for a logic device (see "Low k1 Logic Design using Gridded Design Rules" by Michael C. Smayling et. al, Proc. of SPIE Vol. 6925 (2008)). In the 1D-GDR technique, a line and space (L/S) pattern with a single pitch is formed on a wafer in advance and then a plurality of pattern elements such as a hole pattern or a cut pattern is exposed on an equi-grid with the same size of image in a plurality of locations. With this method, the L/S pattern with a single pitch is cut by the pattern element or the space is filled to produce a device. The 1D-GDR technique may not only have a large exposure margin, but also reduce an area of a cell, as compared with a pattern having a high degree of freedom such as a two dimensional layout pattern which is used in the related art.

Further, as a verification example of the 1D-GDR, a device below 20 nm Node can be formed (see "Sub-20 nm Logic Lithography Optimization with Simple OPC and Multiple Pitch Division" by Michael C. Smayling et. al Proc. Of SPIE Vol. 8327 (2012)).

In the inventions discussed in Japanese Patent Nos. 3073156 and 3827659, the calculation is performed without adjusting an exposure condition of the exposure apparatus when the OPC is performed on the cell. If the cell OPC is performed while fixing the exposure condition, when the exposure condition is not appropriate, a desired image performance cannot be obtained. In that case, if the mask pattern is corrected while adjusting the exposure condition to obtain an appropriate exposure condition when a cell on which the cell OPC is performed is arranged to design the mask pattern to perform the chip level OPC, a line width of the pattern or an amount of correction in a position or a portion to be corrected is increased so that an amount of calculation is increased. Therefore, there is a problem in that a calculating time is increased.

Further, as discussed in Japanese Patent No. 3073156, if the cell OPC is repeatedly applied to every cell, a calculating time for all cells is increased.

Further, a pattern of a cell may be designed to be a cut pattern which is used for one dimensional layout discussed in "Low k1 Logic Design using Gridded Design Rules" by Michael C. Smayling et. al., Proc. of SPIE Vol. 6925 (2008) and "Sub-20 nm Logic Lithography Optimization with Simple OPC and Multiple Pitch Division" by Michael C. Smayling et. al., Proc. Of SPIE Vol. 8327 (2012). However, when the cell OPC discussed in Japanese Patent Nos. 3073156 and 3827659 is performed on the above pattern, the same problem may occur.

SUMMARY OF THE INVENTION

The present invention is directed to a cell pattern generation method in which cells are arranged to generate a pattern of a mask in a short time.

According to an aspect of the present invention, a pattern generation method for generating a pattern of a cell used to generate a pattern of a mask using a computer, includes obtaining data of pattern of the cell, calculating image of the pattern of the cell to obtain an evaluation value of the images by repeatedly changing a parameter value of an exposure condition when the mask which has the pattern of the cell is illuminated to project image of the pattern of the cell onto a substrate to expose the substrate, and a parameter value of the pattern of the cell, and determining parameter value of the pattern of the cell when the evaluation value satisfies a predetermined evaluation standard.

Further features of the present invention will become apparent from the following description of exemplary embodiments with reference to the attached drawings.

BRIEF DESCRIPTION OF THE DRAWINGS

FIG. 4 is a diagram illustrating a type of a pattern of a cell.

DESCRIPTION OF THE EMBODIMENTS

The present invention can be applied to generation of data of a pattern of a mask (an original plate). The mask is used to manufacture various devices, for example, a semiconductor chip such as an IC or an LSI, a display device such as a liquid crystal panel, a detection device such as a magnetic head, or an image capturing device such as a CCD sensor or used for a micro mechanics.

Figure 1:
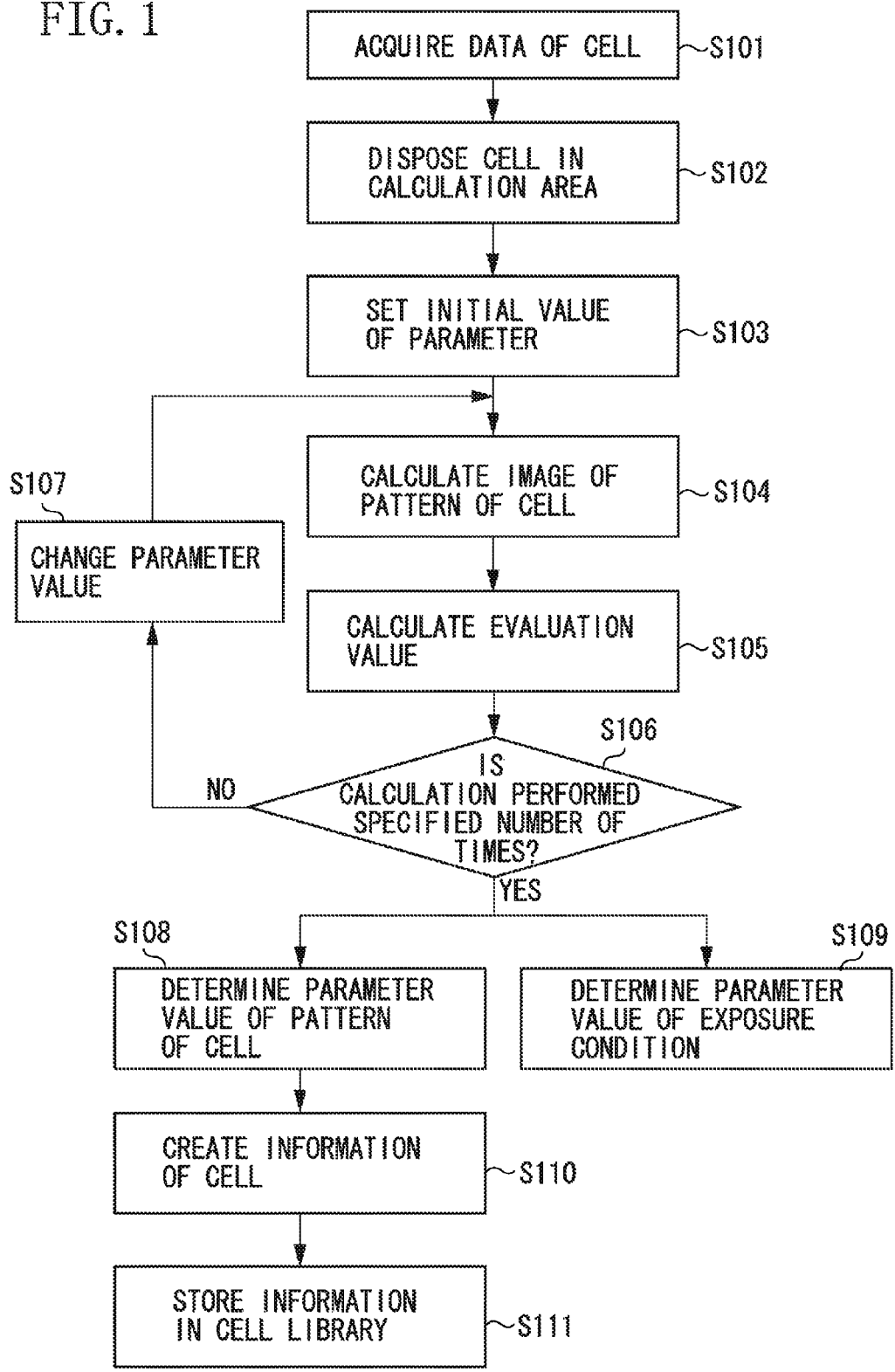
FIG. 1 is a flowchart illustrating a generation method of a pattern of a cell.

A generation method of a pattern of a cell according to an exemplary embodiment will be described. FIG. 1 is a flowchart illustrating a generation method of a pattern of a cell according to the present exemplary embodiment. Such a generation method is performed by an information processing apparatus such as a computer.

In the present exemplary embodiment, standard cells indicating logic elements are arranged to generate a pattern of a cell. The generation method according to the present exemplary embodiment may be implemented by supplying a program which is capable of executing respective steps illustrated in FIG. 1 to the information processing apparatus (computer) through a network or a recording medium and allowing the information processing apparatus to read and execute the program stored in a storage medium such as a memory.

First, in step S101, a computer obtains data of a pattern of a plurality of cells. The data may be obtained by selecting the data from a plurality of cells of a cell library 10 (not illustrated) stored in a memory of the computer or obtained by reading a plurality of cells input by a user.

A cell having a critical image performance (a cell is highly likely to cause poor resolution) may be selected or all cells which are likely to be disposed on a mask may be selected.

Figure 2:
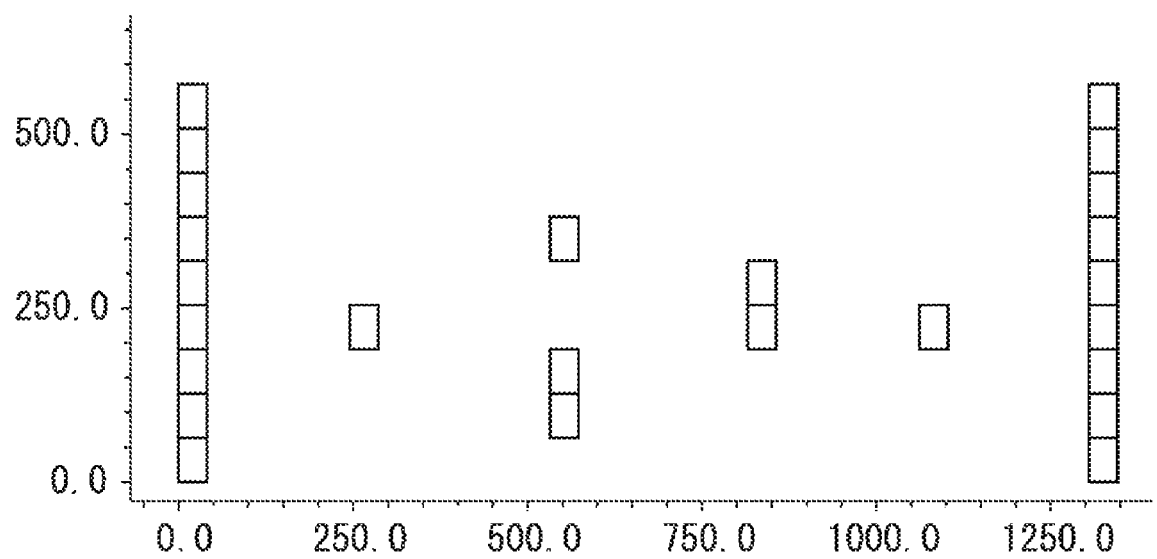
FIG. 2 is a diagram illustrating an example of a pattern of a cell.

The data is, for example, GDSII data of a design value of a cell. FIG. 2 is a diagram of a pattern including a plurality of rectangular pattern elements, which is a hole pattern or a cut pattern used in a one dimensional layout technique.

The cell library 10 includes cell information such as an LEF file including a name and a range of a cell, input/output pin information, and information of a layout physical property of a wiring layer, an LIB file including a variation of a parasitic capacitance or a temperature potential of a transistor, design data of a logical circuit or GDSII data of a design value. Diffusion of a transistor, a gate, a contact, a metal, and a Via are included in one cell.

Next, in step S102, the plurality of cells selected in step S101 is sufficiently separated so that an optical proximity effect is not exerted between the cells, and is disposed in the calculation area. If the number of selected cells is large and thus the selected cells are not disposed in one calculation area, the cells are disposed in a plurality of calculation areas and the subsequent calculation processing may be performed on each of the calculation areas by separate computers or time-sequentially performed by one computer in order. In other words, the plurality of selected cells is divided into a first cell group and a second cell group and the groups may be independently calculated.

Next, in step S103, initial values of parameters of a pattern of the plurality of cells and parameters of exposure conditions are set. The parameters of the pattern of the cells include a line width and a shifted amount of the pattern. The exposure conditions are conditions when a mask is illuminated to project an image of a pattern of a mask onto a wafer (substrate) to expose the wafer. The parameters of the exposure conditions include a shape of a light intensity distribution (effective light source distribution) on a pupil surface of an illumination optical system of an exposure apparatus, an NA, an aberration, and an exposure wavelength of a projection optical system.

Next, in step S104, when a pattern of the cells having a set initial value is assumed to be in a mask and the mask is illuminated under the exposure condition of the initial value to expose the substrate, an image of a pattern of the plurality of cells is calculated. Next, in step S105, the calculated image is evaluated using a predetermined evaluation index (which will be described below) to obtain an evaluation value.

In step S106, it is determined whether the number of times of the calculations of the image performed in step S104 and the number of times of the calculations of the evaluation value performed in step S105 reach a specified number of times. If it is determined they have not reached the specified number of times in step S106, in step S107, the parameter value of the pattern of the plurality of cells and the parameter value of the exposure condition are changed. Then, the calculation of the image in step S104 and the calculation of the evaluation value in step S105 are performed using the changed parameter values. These calculations are performed by repeatedly changing the parameter values until the number of times of calculations reaches the specified number of times to obtain a plurality of evaluation values.

If the number of times of the calculations of the image performed in step S104 and the number of times of calculations of the evaluation value performed in step S105 reach the specified number of times, in step S108, a parameter value of a pattern of cells when an evaluation value among a plurality of evaluation values satisfies a predetermined evaluation standard is determined. Further, in step S109, a parameter value of the exposure condition when the evaluation value satisfies a predetermined evaluation standard is determined. The evaluation standard may be the best value (a maximum value or a minimum value) or a predetermined acceptable value.

Next, in step S110, information of a cell which is added to the pattern of each of the plurality of cells determined in step S108 is created. In step S111, the information is stored in a cell library 20 which is different from the cell library 10 as an OPC completed cell and managed as information of a logic element which is usable for the mask pattern design.

Further, in step S106, the calculation of the image and the calculation of the evaluation value are performed by repeatedly changing the parameter values until the number of times of the calculations reach the specified number of times. In this case, after the calculation of the evaluation value in step S105, it is determined whether the evaluation value satisfies the acceptable value (evaluation standard) every time and when the evaluation value satisfies the acceptable value, the parameter value may be determined.

Figure 3:
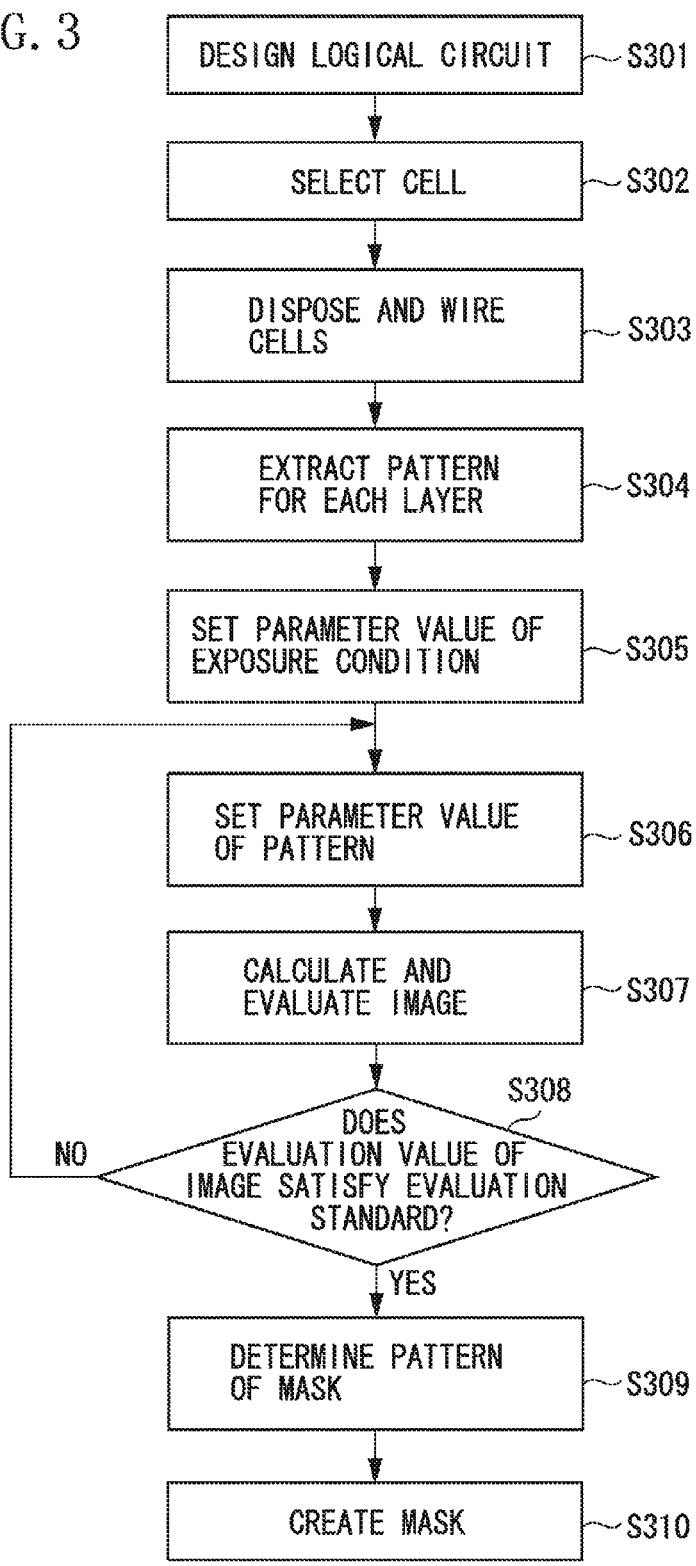
FIG. 3 is a flowchart illustrating a generation method of a pattern of a mask.

Next, a generation method of a pattern of a mask according to the present exemplary embodiment will be described. FIG. 3 is a flowchart of a generation method of a pattern of a mask according to the present exemplary embodiment. Such a generation method is performed by an information processing apparatus such as a computer.

In step S301, a logical circuit design is performed based on a design specification such as application specific integrated circuits (ASIC) and circuit design data in which logic elements are combined is generated. Generally, information is recorded in a format called Netlist and a portion where the logical circuit is mounted is indicated. In step S302, the cell corresponding to the logic element generated in step S301 is selected from the cell library 20. Then, in step S303, the layout and wiring of the cells are performed by inputting the selected cell in a layout and route tool.

For example, the layout and route tool such as an IC compiler manufactured by Synopsys, Inc or an Olympus-SoC manufactured by Mentor Graphics Corporation is used to determine the layout and route of the cell. Further, the cell library 10, which includes a cell of a design value on which the OPC is not performed, is used to generate a general mask pattern in many cases and the cell having an image performance which is not critical may be selected from the cell library 10.

Next, in step S304, a pattern is extracted for each layer of the mask. For example, one layer pattern is extracted for each disposed cell and the layer patterns are connected to each other so that a pattern file of the entire surface of the chip can be obtained, which is generally referred to as a flatten processing. The processing is repeated for each layer to obtain mask pattern information of the entire surface of the chip for each exposure process. Next, in step S305, a parameter value of the exposure condition is set. In the case of a cell OPC, the parameter value of the exposure condition is set to be the same value as or approximate value of the parameter value of the exposure condition determined in step S109.

Next, in step S306, a parameter value of the pattern extracted for each layer is set. Next, in step S307, when the pattern set in step S306 is disposed in the mask, the mask is illuminated under the exposure condition set in step S305, an image of the pattern of the mask when the image of the pattern of the mask is projected onto the wafer is calculated, and the image is evaluated.

In step S308, it is determined whether the evaluation value of the image satisfies a predetermined evaluation standard (acceptable value). If the evaluation value of the image does not satisfy the evaluation standard, the operation returns to step S306, and the parameter value of the pattern is changed to be reset to calculate and evaluate the image.

In steps S306 to S308, the mask pattern is adjusted (OPC) to approximate the image of the pattern of the mask to a desired size of an image forming pattern. In step S309, if the evaluation value of the image satisfies the evaluation standard, the pattern of the mask in that case is determined. Further, the OPC in steps S305 to S309 on the entire surface of the chip may be performed using Calibre manufactured by Mentor Graphics Corporation or Tachyon manufactured by Brion Technologies, Inc.

If the pattern is determined, in step S310, a data format which is required to render the mask pattern is converted and a mask is generated by a general electron beam lithography. The processing in steps S305 to S310 is repeatedly performed for each layer of the mask to generate a mask pattern for a critical process of a semiconductor device.

According to the present exemplary embodiment, an optical image is calculated for each cell group including a plurality of cells using the exposure condition and the parameter of the pattern of the cell to optimize the image performance, so that the calculation may be performed in a shorter time as compared when the calculation is performed for each cell.

Further, according to the present exemplary embodiment, before determining the pattern of the mask having a desired image performance, the pattern of each of the cells is determined using the exposure condition and the parameter of the pattern of the cell to optimize the image performance. Therefore, it is possible to use the pattern of the OPC completed cell which is calculated based on the appropriate exposure condition before determining the pattern of the mask and thus reduce the calculation time required to determine the pattern of the mask.

An example, in which the pattern generation method described in the above exemplary embodiment is applied to the generation of a mask pattern of a metal process which uses a standard cell of 1D-GDR of 20 nm Node, will be described.

In the 1D-GDR device, an isolated groove is formed by, after forming a minute line and space (L/S) pattern, filling the L/S pattern with a cut pattern which eliminates a part of a space of the L/S, and etching the entire L/S pattern. Even though the L/S is uniform regardless of the cell, generally the number and the arrangement of the cut patterns are varied in each of the cells. A mask of the cut pattern process will be described as an example. This is same as in the cut pattern for a gate pattern which eliminates a part of a line of the L/S.

As the exposure condition of the exposure apparatus, a tangential polarized illumination with a light source wavelength of 193.368 nm, a projection system numerical aperture of 1.35, an immersion refractive index of 1.437, and a resist refractive index of 1.683, is used. The mask is a binary mask and in the mask, each pattern element is black (light shielding section) and a background is white (transmission section), which is a bright field.

Figure 4:
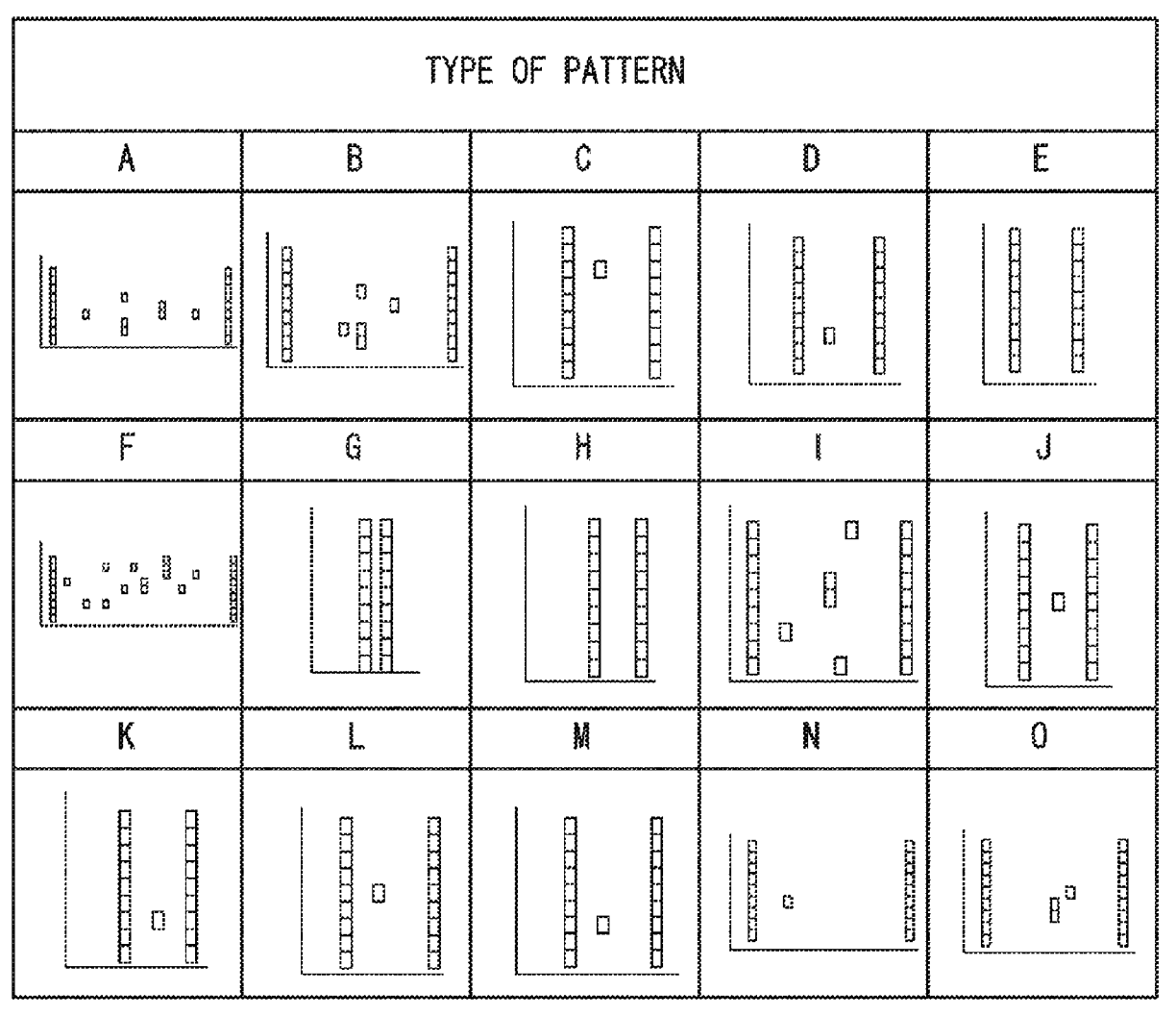

In the 1D-GDR of 20 nm Node, generally, a Gate pitch is 84 nm and a metal pitch is 64 nm. Therefore, a cell in which an L/S having a length of 84 nm in an X-direction and a length of 64 nm in a Y direction form a grid is obtained. In the present exemplary embodiment, as illustrated in FIG. 4, a design pattern of a plurality of standard cells is selected from the cell library 10.

An area of each of the cells (a horizontal length (X), a vertical length (Y)) is as described below in unit of nm.

A: (1353, 640)
B: (861, 640)
C: (369, 640)

D: (369, 640)
E: (287, 640)
F: (1599, 640)
G: (123, 640)
H: (205, 640)
I: (615, 640)
J: (287, 640)
K: (287, 640)
L: (369, 640)
M: (369, 640)
N: (943, 640)
O: (779, 640)

Generally, if the number of divisions when the effective light source distribution is divided into a plurality of elements (point light sources) is fixed, a length of one side of the calculation area of the optical calculation is proportional to wavelength/NA. However, in recent years, since the miniaturization of the pattern of the cell has proceeded without changing the wavelength and the NA of the exposure apparatus, more cells may be put in the calculation area without changing the calculation area. In the above exposure condition, the calculation area of the optical image is approximately 4.5 um square.

Figure 5:
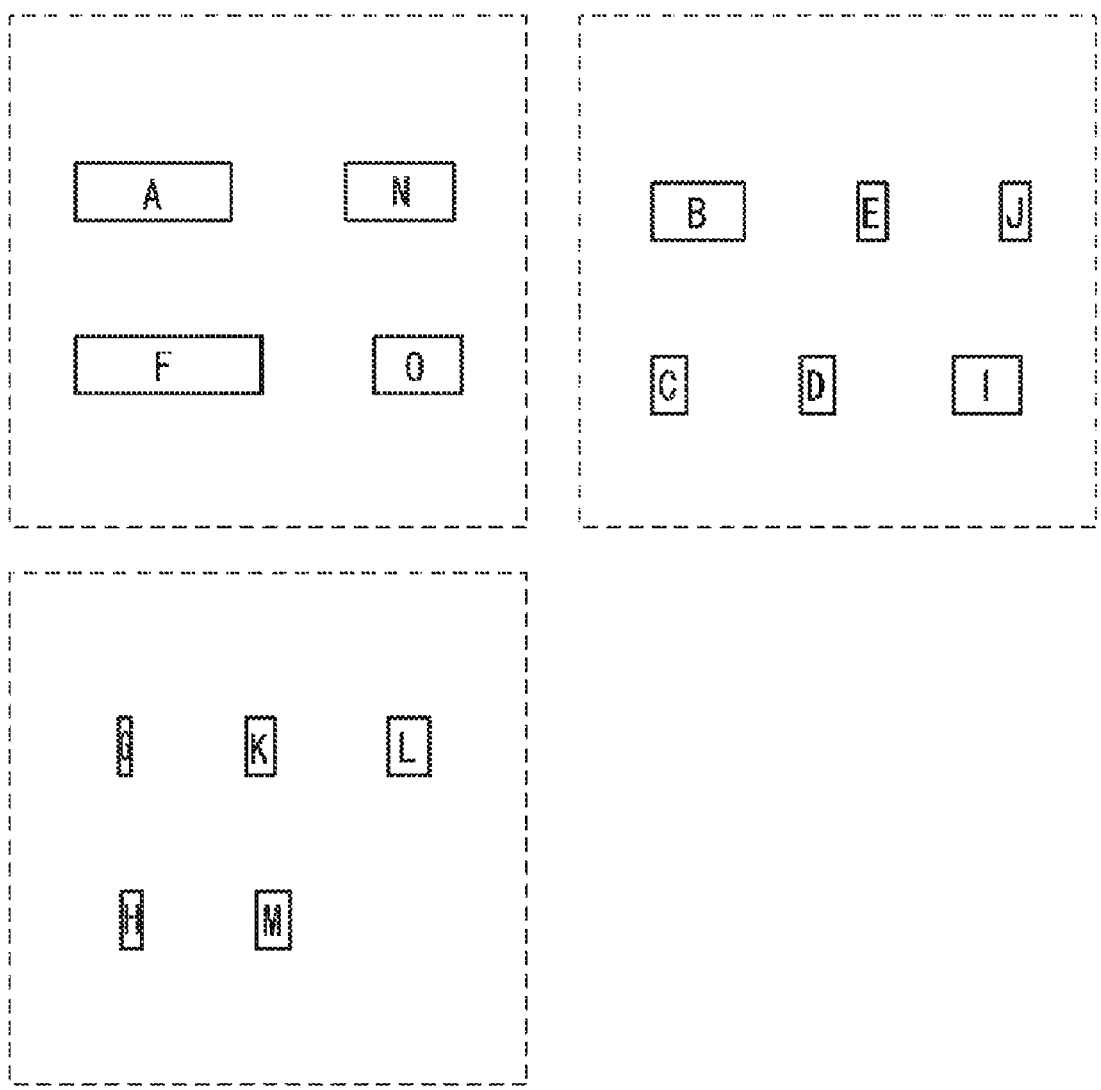
FIG. 5 is a diagram illustrating an arrangement and a calculation area of a plurality of cells.

FIG. 5 illustrates an example of the calculation area and arrangement of a plurality of cells. Frames indicated by dotted lines are calculation areas. The spaces between the cells (cells A to O) are set separately by 1 um in both the X and Y directions in the calculation area of the optical calculation, total 15 selected cells can be disposed in three calculation areas. A cell group including cells A, F, N, and O, a cell group including cells B, C, D, E, I, and J, and a cell group including cells G, H, K, L, and M are each disposed in one calculation area.

Therefore, if the calculation of the optical image of the pattern is repeated for each cell, 15 times of calculation are required, but according to the present exemplary embodiment, only three times of calculation are required. Thus, the plurality of cells is combined to calculate the optical image so as to perform the calculation in a shorter time.

Figure 6:
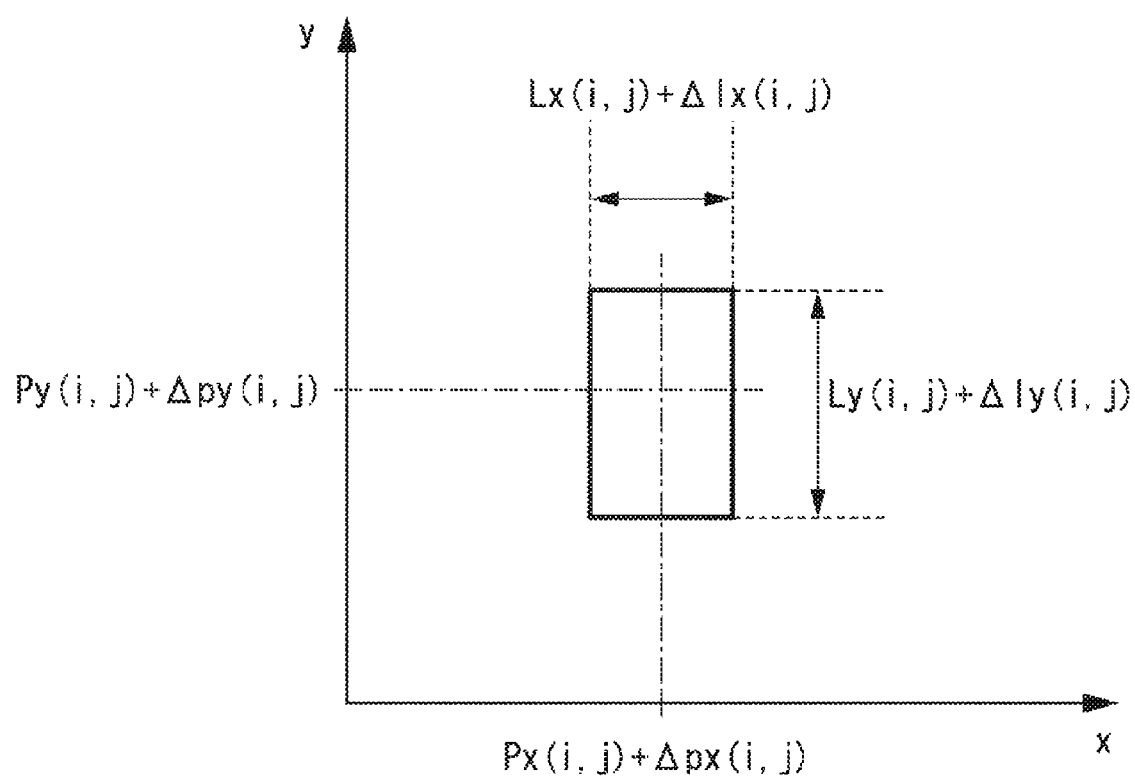
FIG. 6 is a diagram illustrating a parameter of a pattern element.

The pattern of each of the cells is configured by a pattern including a plurality of pattern elements illustrated in FIG. 6. Design values of a width of a pattern element (i, j) are constant numbers $Lx(i, j)$ and $Ly(i, j)$, and design values of a coordinate of a pattern element (i, j) is constant numbers $Px(i, j)$ and $Py(i, j)$. i is a variable indicating the cells A to O of FIG. 4. j indicates a number of the pattern element in the cell.

Variations of the line widths of each of the pattern element are $\Delta lx(i, j)$ and $\Delta ly(i, j)$, and the variables are parameters of the pattern of the cell. Further, a shifted amount of the coordinate of each of the pattern elements is $\Delta Px(i, j)$ and $\Delta Py(i, j)$ and the variables are also parameters of the pattern of the cell. Further, the parameters of the pattern of the cell may be a distance (line width) between opposite sides of the pattern element, for example, $Lx(i, j)+\Delta lx(i, j)$.

In the present exemplary embodiment, the design values of the line widths of each of the pattern elements are $$Lx(i,j)=41 \text{ nm}, \forall i \forall j$$

$$Ly(i,j)=64 \text{ nm}, \forall i \forall j$$

When the plurality of pattern elements is adjacent to each other, a restriction that positions of edges (borders) of adjacent sides are fixed is used.

Figure 7A:
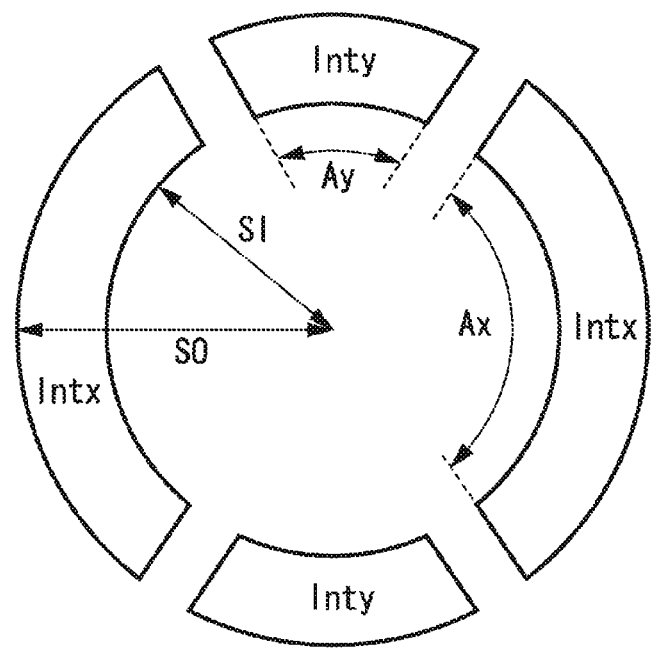
FIGS. 7A and 7B are diagrams illustrating parameters of an effective light source distribution.
Figure 7B:

FIGS. 7A and 7B illustrate parameters of the exposure condition. In the present exemplary embodiment, a shape of the effective light source distribution of the exposure apparatus is parameterized to be defined as a parameter of the exposure condition. FIG. 7A illustrates a pupil space of a quadrupole illumination of the illumination optical system. A light intensity distribution (black display) is between an outer σSO and an inner σSI and represented by an aperture angle Ax of a pole indicated as Intx and an aperture angle Ay of a pole indicated as Inty. FIG. 7B illustrates a light intensity of each pole, and the light intensities of Intx and Inty are represented by a value obtained by normalizing the light intensity of Intx by one and it is assumed that the light intensity of each pole is uniformly distributed.

A pattern to be evaluated is a figure (hereinafter, referred to as an optical image) obtained by slicing an aerial image of the mask pattern on an image plane by a threshold value Ith and connecting the obtained level lines. In the present exemplary embodiment, even though the optical image is used to simplify the description, an image obtained by performing a process proximity correction on the optical image using a resist parameter indicating a photosensitive and development properties of a resist photosensitive material or an etching parameter of a substrate material may be used.

Variable ranges of the parameters of the exposure condition and the parameters of the cell pattern are as follows.

$$0.7 \leq SO \leq 0.98$$

$$0.5 \leq (SO/SI) \leq 0.8$$

$$20° \leq Ax \leq 90°$$

$$20° \leq Ay \leq 90°$$

$$Intx=1$$

$$0 \leq Inty \leq 1$$

$$10 \leq \Delta lx \leq 100$$

$$10 \leq \Delta ly \leq 100$$

$$-5 \leq \Delta px \leq +5$$

$$-5 \leq \Delta py \leq +5$$

As the exposure condition, even though the shape of the effective light source distribution is a variable, the numerical aperture of the projection optical system may be a variable in addition to the shape of the effective light source distribution. Further, the threshold value Ith is $0 \leq Ith \leq 1$.

Targets of the image of the pattern to be evaluated are a root mean square (RMS) and a normalized image log slope (NILS) of the line width errors of each of the pattern elements. Further, a focal depth F where EL (exposure margin) of a size CDx of an X cross-section including a center of the design value of each of the pattern elements and a size CDy of a Y cross-section including a center of the design value of each of the pattern elements satisfies 5% is also a target to be evaluated. Further, a position shift error RGx and a position shift error RGy of the pattern element are also evaluation targets.

It is desirable that the line width error and the position shift error of the pattern element are minimized and NILS and the focal depth are maximized, so that in the present exemplary embodiment, the following Equation 1 is used as the evaluation index (evaluation function) P. A total RMS value of all evaluating points of the image of the pattern of the plurality of cells with respect to the line width error, and a worst value (minimum value) among all evaluation points of the image of the pattern of the plurality of cells with respect to NILS and the position shift error, and the focal depth are used as terms of the evaluation function.

$P$=line width error RMS/line width error RMS acceptable value+NILS acceptable value/(NILS minimum value+0.001)+minimum value of the position shift error $RGx$ and $RGy$/position shift error acceptable value+focal depth acceptable value/(minimum value of focal depth $F$+0.001)     (1)

Further, line width error RMS acceptable value=1% of target line width

NILS acceptable value=1.5

Position shift error acceptable value=5 nm

Focal depth acceptable value=70 nm

First, images of the patterns for all selected cells are calculated, and the line width error RMS, NILS, the position shift error, and the focal depth F for each of all the evaluating points of the images of the patterns of the plurality of cells are calculated.

A total RMS value of all evaluating points of the image of the pattern of the plurality of cells for the line width error, and a worst value (minimum value) among all evaluation points of the image of the pattern of the plurality of cells for NILS and the position shift error, and the focal depth are calculated to obtain a value of the evaluation function to be determined as the evaluation value.

The evaluation index is not limited thereto, and can be set using a value obtained by adding a value evaluating the image of the pattern of each of the plurality of cells for the plurality of cells or a minimum value or a maximum value among the values evaluating the images of the patterns of the plurality of cells.

Then, each of the parameter values is changed to minimize the evaluation value of the evaluation index so that the optimization thereof is performed. In the present exemplary embodiment, the parameters of the exposure condition are nine and the parameters of the pattern of the plurality of cells are 745 so that total 754 parameters are optimized.

Figure 8A:
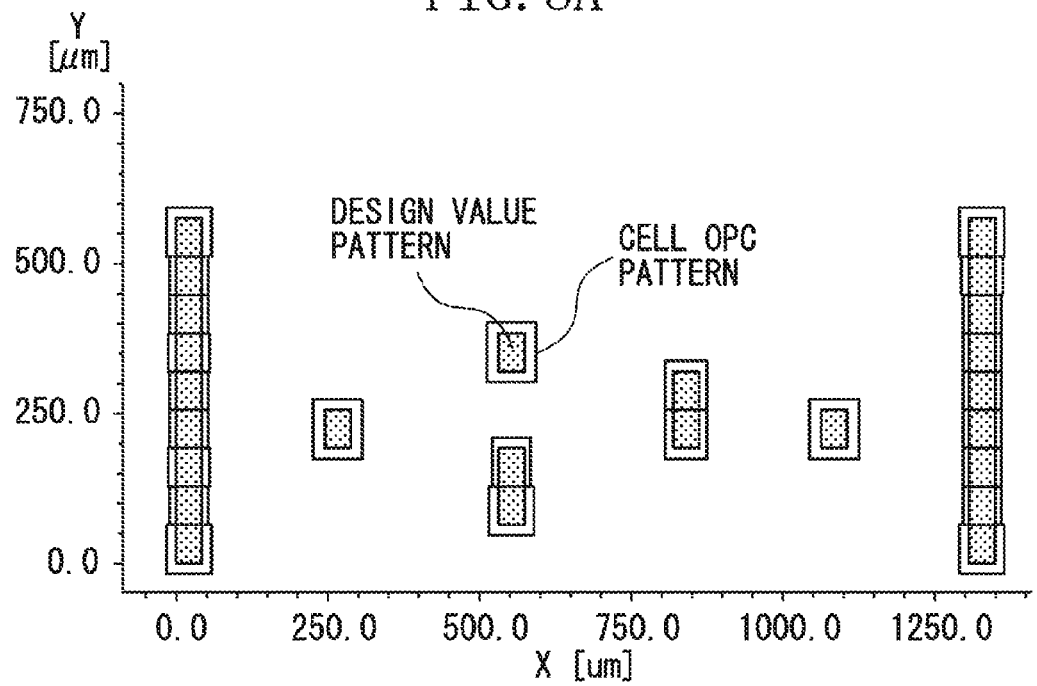
FIGS. 8A and 8B are diagrams each illustrating an optimization result of a pattern of a plurality of cells.
Figure 8B:
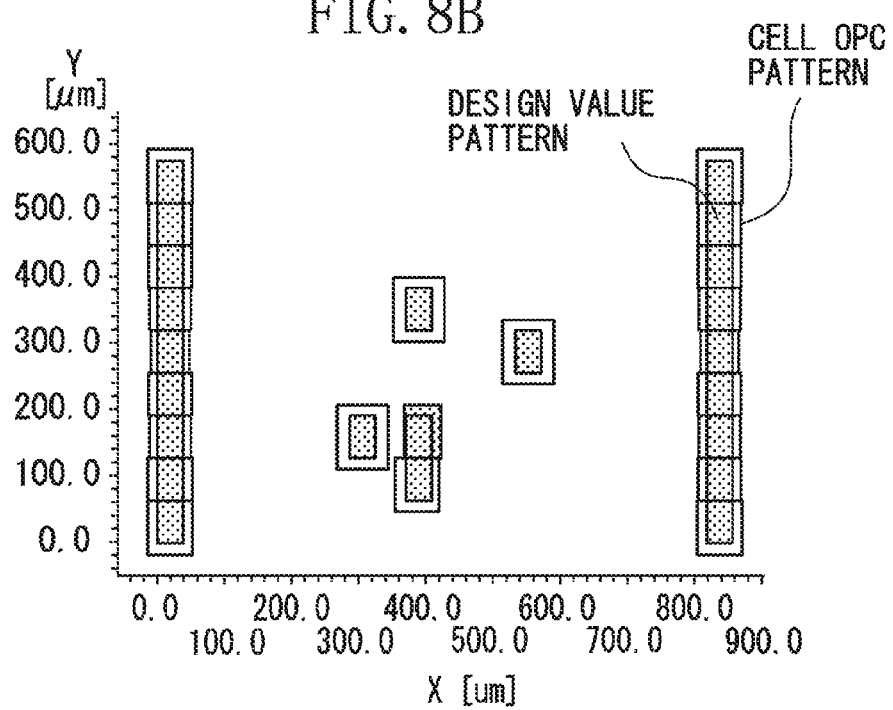

FIGS. 8A and 8B each illustrate a pattern of the optimization result. A gray (dotted) area portion represents a pattern element of the design value of the cell and a solid line frame which is illustrated to enclose the pattern element represents an outer shape of the corrected pattern element after being optimized by the cell OPC.

FIG. 8A is an example of the cell A illustrated in FIG. 4 and FIG. 8B is an example of the cell B illustrated in FIG. 4, and it is understood that the design value of the cell and the shape after being optimized are widely changed. The calculated pattern of the cell after being optimized is stored in the cell library 20 in a GDSII data format. The GDSII data is added to the information of the cell of the original design value to constitute a cell OPC library. This is the same as in the cells C to O.

The optimization result of the parameter of the effective light source distribution is described below.

$SO$=0.85

Ratio=$SI/SO$=0.703

$Ax$=57°

$Ay$=61°

$Inty$=0.442

The threshold value Ith is 0.4086.

The evaluation index is one in the present exemplary embodiment, but the number of evaluation indexes is not limited to one. For example, if a plurality of different evaluation indexes is set, the pattern of the cell and the optimization result of the exposure condition are changed. That is, the parameter values of the pattern of the cell determined for each of the evaluation indexes are different from each other.

Cell libraries are created to store the parameters of the cell determined using the setting of the evaluation indexes, and the appropriate cell library may be selected according to the purpose. Further, a plurality of sets of combinations of a parameter of the exposure condition after optimization and a parameter of the pattern of the cell may be stored in a storage medium and managed.

Figure 9:
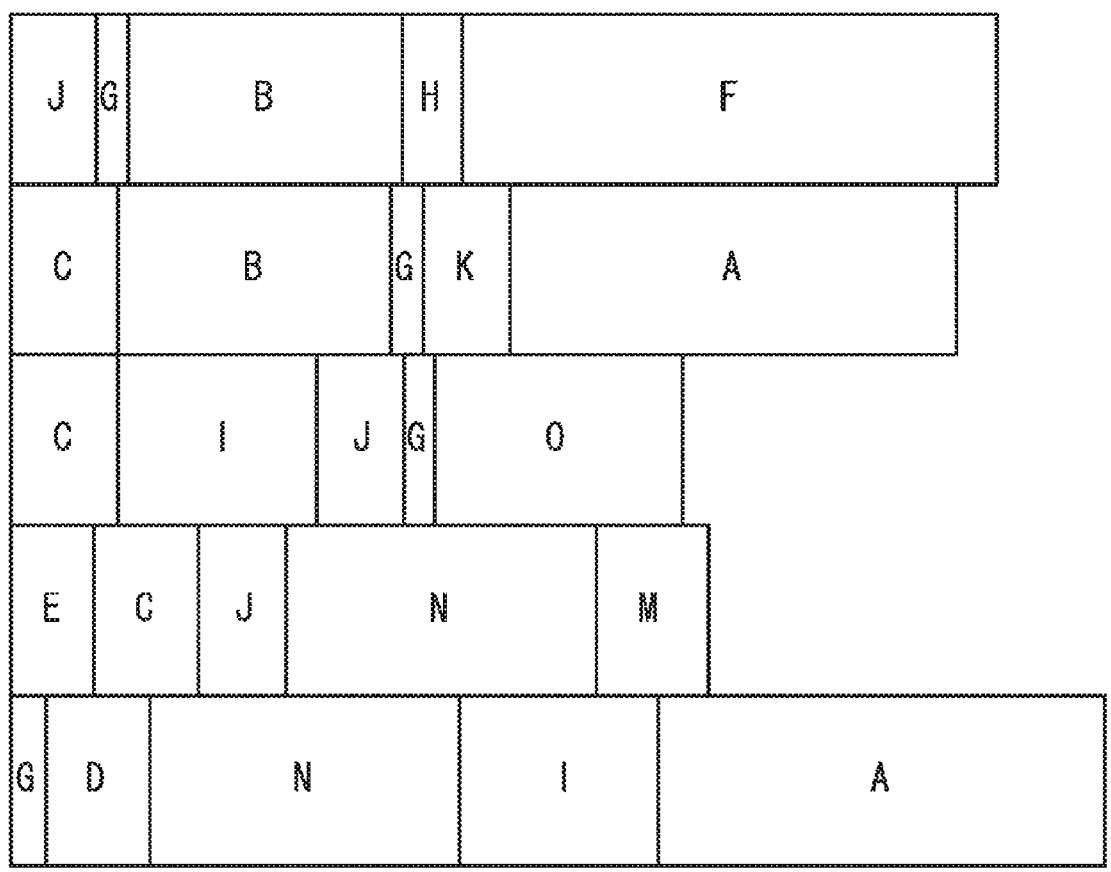
FIG. 9 is a diagram illustrating a layout on a test chip in which cells are adjacently arranged.

Next, a method for generating a mask pattern using the OPC completed cell stored in the cell library will be described. FIG. 9 illustrates a pattern after selecting the OPC completed cell from the cell library to adjacently dispose the cell patterns. In order to simplify the description, arbitrary standard cells included in the cells A to O are adjacently disposed as 5 by 5 to form test cells using total 25 cells. The vertically adjacent cells are bonded to each other while being separated as much as one grid pitch of the metal.

As the exposure condition, a tangential polarized illumination with a light source wavelength of 193.368 nm, a projection system numerical aperture of 1.35, an immersion refractive index of 1.437, and a resist refractive index of 1.683, is used. Here, as the parameter of the effective light source distribution, even though a value equal to a value of the optimized result is used, the value may not be equal to the value of the optimized result. For example, an outer $\sigma SO2$, a ratio 2 of an outer $\sigma$ and an inner $\sigma$, an aperture angle $Ax2$ of a pole in the X direction, an aperture angle $Ay2$ of a pole in the Y direction, the light intensity $Intx2$ of the pole in the X direction, the light intensity $Inty2$ of the pole in the Y direction can be used in the following range.

$e$=0.2

$e2$=60

$e3$=0.5

$SO*(1-e) \leq SO2 \leq SO*(1+e)$

Ratio*$(1-e) \leq$ Ratio2 $\leq$ Ratio*$(1+e)$ $Ax-e2 \leq Ax2 \leq Ax+e2$ $Ay-e2 \leq Ay2 \leq Ay+e2$ $Intx*(1-e3) \leq Intx2 \leq Intx*(1+e3)$ $Inty*(1-e3) \leq Inty2 \leq Inty*(1+e3)$ For example, the outer $\sigma$ may be changed in a range different from a value SO of the optimized result by a predetermined amount e.

The mask is a binary mask in which a pattern part is black and a background is white, which is a bright field.

The parameter value of the exposure condition is set to set the pattern illustrated in FIG. 9 as an initial value. Then, the OPC is performed on each of the patterns while calculating the image of each of the patterns and the optimization is performed while changing the parameter of each of the patterns.

When a size of the X cross-section including a center of the design value of each of the parameter elements is CDx and a size of the Y cross-section is CDy, a RMS of a difference from the design value of the entire pattern elements is used for the evaluation index. An equation of the RMS is illustrated in the following equation.

$$CDRMS[\%] = \sqrt{\frac{1}{n_x + x_y}\left[\sum_i\sum_j\left\{\frac{CDx(i,j) - CDx_0(i,j)}{CDx_0} \times 100\right\}^2 + \sum_i\sum_j\left\{\frac{CDy(i,j) - CDy_0(i,j)}{CDy_0} \times 100\right\}^2\right]}$$ [Equation 1]

Further, nx is a total evaluation value of the X cross section, ny is a total evaluation number of the Y cross section, and CDx0(i, j) and CDy0(i, j) are design values.

Figure 10:
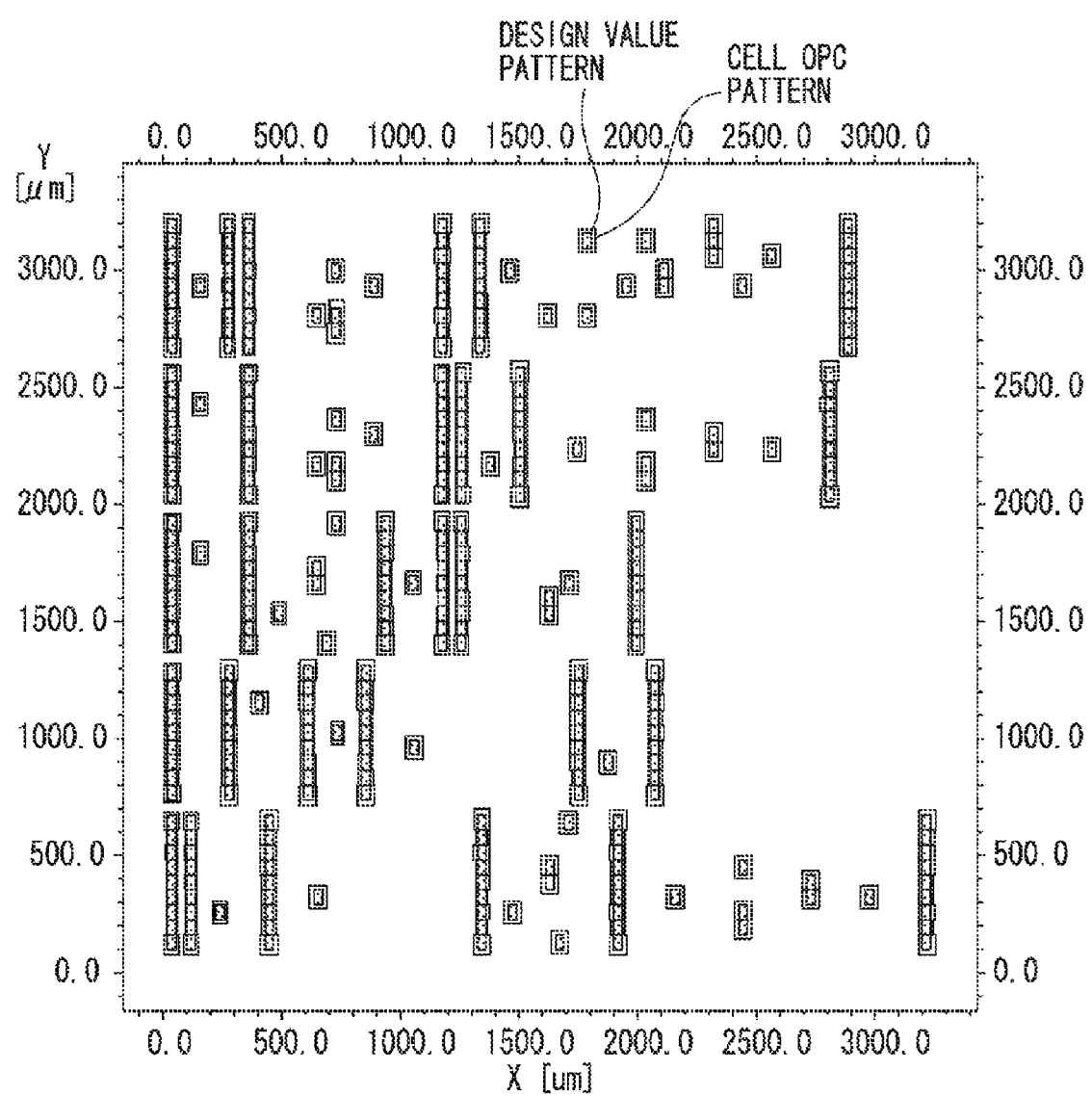
FIG. 10 is a diagram illustrating a mask pattern when an OPC is performed in a metal layer of a test chip according to an exemplary embodiment of the present invention.

FIG. 10 illustrates the result. A gray (dotted) area portion illustrated in FIG. 10 represents the pattern of the design value cell and a solid line frame illustrated to enclose the gray pattern represents an outer shape of the corrected pattern on the entire chip.

Figure 11:
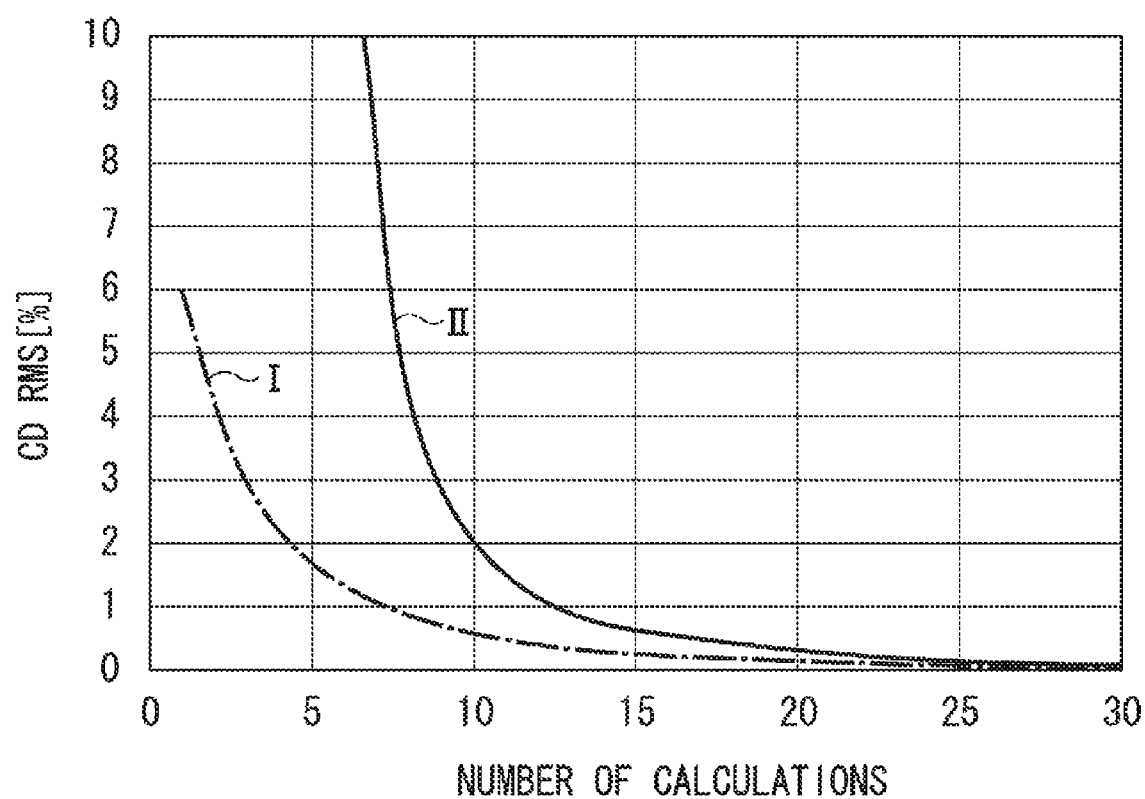
FIG. 11 is a diagram illustrating a calculation result of an exemplary embodiment of the present invention and a first comparative embodiment.

Further, FIG. 11 illustrates the number of calculation times of the optical calculation for the OPC, and the RMS of the CD (CDRMS) of the mask pattern. FIG. 11 illustrates the calculation times of the optical calculation for the OPC in a horizontal axis and the residual error of the CDRMS in a vertical axis.

A curve I is a result when the OPC completed cell is selected from the cell library to be disposed on the chip and the OPC is performed on the entire chip, like the present exemplary embodiment. A curve II is a result of a comparative example when the cell of the design value on which the OPC is not performed is selected from the cell library to be disposed on the chip and the OPC is performed on the entire chip.

If the acceptable value of the CDRMS is 2%, it is understood that in the curve I, the CDRMS reaches the acceptable value when the number of calculations is five, and in the curve II, the CDRMS reaches the acceptable value when the number of calculations are ten. That is, the number of calculations of the curve I are approximately half the number of calculation times of the curve II.

Therefore, a calculating time required for the chip level OPC becomes approximately ½. On the other hand, if a specified number of calculations is seven, the CDRMS in the curve I is 1.02% and the CDRMS in the curve II is 7.49%.

That is, the curve I has a smaller value of residual error of the CDRMS which reaches a constant number of calculations (within a predetermined time). Therefore, according to the generation method of a mask pattern in the present exemplary embodiment, the pattern of the mask having a desired resolution performance may be generated in a shorter time. The image performance is evaluated using the mask pattern of the curve I to obtain a DOF of 69 nm when EL is 5%.

In order to evaluate an achievement degree of the image performance, the exposure condition and the mask pattern are optimized using the mask pattern after chip arrangement and the evaluation index of Equation 1. The CDRMS is converged to be 2% by performing approximately 3,000 calculations and DOF of 68 nm when EL is 5% is obtained. The image performance obtained by the result which requires 600 times of the number of calculations is equal to the result of the mask of the curve I. In other words, according to the mask pattern generation method of the present exemplary embodiment, not only CDRMS but also DOF may obtain a good performance by the smaller number of calculations.

Further, in order to compare with the related art, as a second comparative example, when the pattern of the cell was determined, only the parameter value of the pattern of the plurality of cells was changed without changing the parameter value of the exposure condition to calculate the cell OPC. The parameters of the patterns of the cells are five as described below and the variable range of the parameter value is as follows.

$10 \leq \Delta Lx \leq 100$ $10 \leq \Delta Ly \leq 100$ $-5 \leq \Delta px \leq +5$ $-5 \leq \Delta py \leq +5$ Further, SO=0.98 (fixed value), Ratio=SI/SO=0.7 (fixed value) and 0≤Ith≤1. A zona orbicular effective light source was used instead of a tetrameric light source.

The evaluation target of the image of the pattern and the evaluation index were the same as those of the present exemplary embodiment. Further, calculation was repeated 200 times or less. After correcting the pattern of the cell, data of the determined pattern of the cell was stored in a cell library 30 of the memory. The cell was selected from the cell library 30 to produce a test chip pattern in which 25 standard cells were adjacently disposed as illustrated in FIG. 9.

Figure 12:
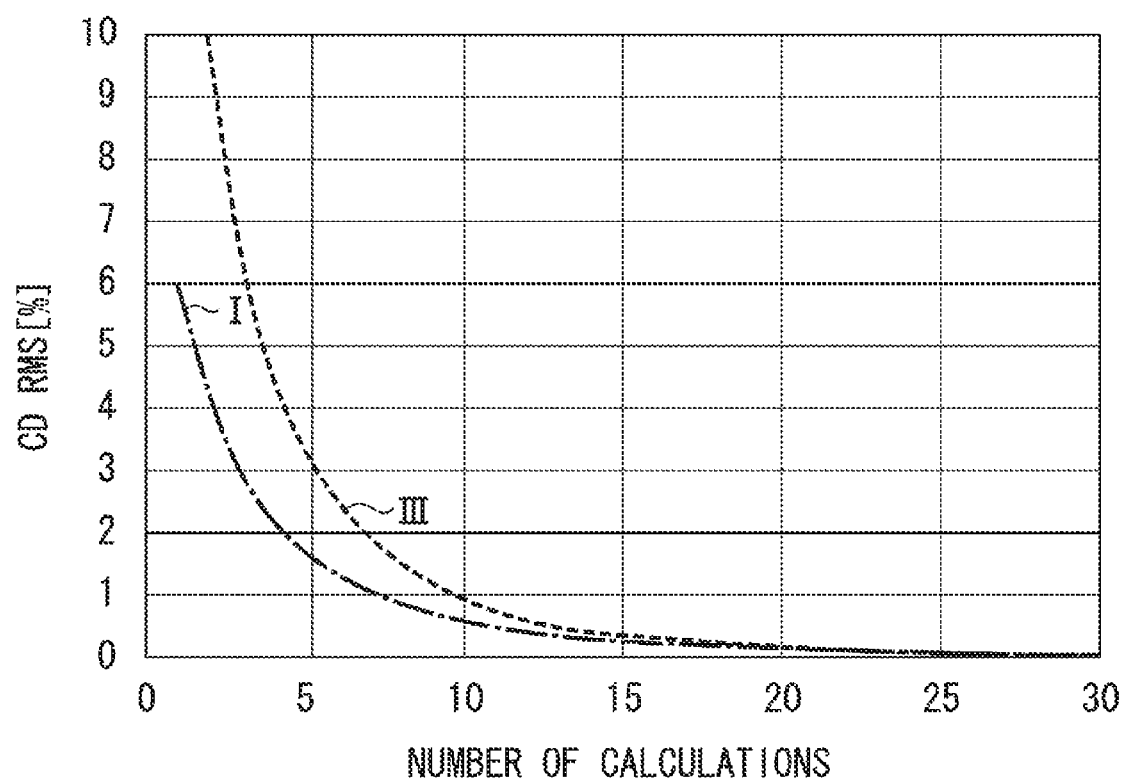
FIG. 12 is a diagram illustrating a calculation result of an exemplary embodiment of the present invention and a second comparative embodiment.

The same calculation as in the generation method of the mask pattern of the present exemplary embodiment was performed. FIG. 12 illustrates the number of calculations of the optical calculation for the OPC and the RMS of the CD of the mask pattern. A curve I represents a result of the present exemplary embodiment and a curve III represents a result of the second comparative example.

If the acceptable value of the CDRMS is 2%, it is understood that in the curve I, the CDRMS reaches the acceptable value when the number of calculations are five, and in the curve III, the CDRMS reaches the acceptable value when the number of calculations are seven. That is, the number of calculations of the curve I is smaller than that of the curve III and the calculating time of the curve I is shorter than that of the curve III.

In the meantime, if the specified number of calculations are seven, the CDRMS in the curve I is 1.02% and the CDRMS in the curve III is 1.87%. That is, the curve I has a smaller value of residual error of the CDRMS which reaches a constant number of calculations (within a time). Therefore, according to the generation method of a mask pattern according to the present exemplary embodiment, the pattern of the mask having a desired resolution performance can be generated in a shorter time.

In the case of the curve III, an appropriate exposure condition is not set when the pattern of the cell is determined, and the cell on which the OPC is performed is disposed under the exposure condition and used as the initial value of the mask pattern, so that the correction amount of the mask pattern by changing the exposure condition is large and thus a longer calculating time is required.

Further, according to the present exemplary embodiment, before determining the pattern of the mask, the pattern of each of the cells is determined using the exposure condition and the parameters of the pattern of the cell to optimize the image performance. Thus, it is possible to shorten the calculating time required to determine the pattern of the mask and an improved image performance can be obtained.

The pattern used for the one dimensional layout is a simple pattern such as a rectangular pattern disposed on an equi-grid so that the correction amount of the pattern when the OPC is performed is not significantly changed by the change of the exposure condition as compared with a pattern which extends in horizontal and vertical directions such as an L shaped pattern.

In the case of the cell pattern which extends in the horizontal and vertical directions but is not disposed on the equi-grid, when the cells are disposed to be adjacent to each other, the correction amount becomes larger at a border or a corner of the pattern or complicated correction of the pattern may be required.

Therefore, the calculation time of the OPC is increased. Accordingly, the generation method of the pattern of the cell and the mask pattern generation method in the present exemplary embodiment are suitable for a pattern used in the one dimensional layout.

Further, the cell produced by the generation method of the pattern of the cell of the present exemplary embodiment may be applicable to layout designs of various devices, so that the generation time of the patterns of the various devices can also be shortened.

The present invention is implemented also by performing the following processing. That is, software (program) which implements the functions of the above-described exemplary embodiments is supplied to a system or a device through a network or various storage media and a computer (or CPU or MPU) of the system or the device reads out and executes the program.

Next, a manufacturing method of a device such as a liquid crystal display device will be described. The liquid crystal display device is manufactured by processes including forming transparent electrodes. The process of forming the transparent electrodes includes a process of applying a photosensitive agent on a glass substrate on which a transparent conductive film is deposited, a process of mounting a mask on an exposure apparatus to expose the glass substrate on which the photosensitive agent is applied, and a process of developing the glass substrate. The mask is manufactured using a pattern of the mask generated as described above.

A device manufacturing method which uses the above-mentioned exposure apparatus is also suitable for manufacturing various devices such as a semiconductor device other than the liquid crystal display device. The above-mentioned method may include a process of mounting the mask manufactured as described above on the exposure apparatus to expose the substrate on which the photosensitive agent is applied and a process of developing the exposed substrate. Further, the device manufacturing method may include other conventional processes (oxidation, film formation, deposition, doping, planarization, etching, resist peeling, dicing, bonding, or packaging).

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures, and functions.

This application claims priority from Japanese Patent Application No. 2012-131117 filed Jun. 8, 2012, which is hereby incorporated by reference herein in its entirety.

What is claimed is:

1. A method for generating a pattern of a cell in a cell library used for a mask manufacturing method for manufacturing the mask, the method comprising:
    obtaining initial patterns of a plurality of cells as a cell pattern;
    setting, as set parameter values, a cell pattern parameter value of the cell pattern and an exposure condition parameter value when the cell pattern is illuminated to project image of the pattern of the cell onto a substrate to expose the substrate;
    calculating, via a computer, images of the plurality of cells having the set cell pattern parameter value on an image plane of a projection optical system under a exposure condition having the set exposure condition parameter value when the plurality of cells are arranged on an object plane of the projection optical system so that the plurality of cells are separated from each other with a distance in which an optical proximity effect is not exerted on each other;
    obtaining an evaluation value of the calculated images;
    changing the set cell pattern parameter value and the set exposure condition parameter value;
    repeating calculating the image and obtaining the evaluation value using the changed parameter values and changing the set parameter values;
    determining, as the patterns of the plurality of cells configured to be used in generating the pattern of the mask, a cell pattern having a cell pattern parameter value when the evaluation value obtained by the repeating satisfies a predetermined evaluation standard; and
    storing the determined patterns of the plurality of cells in the cell library,
    wherein the mask manufacturing method comprises:
    obtaining the determined pattern of the cell from the cell library,
    generating a mask pattern using the obtained patterns of the plurality of cells, and
    manufacturing the mask including the generated mask pattern using data of the generated mask pattern.

2. The method according to claim 1, further comprising determining the exposure condition parameter value when the evaluation value obtained by the repeating satisfies the predetermined evaluation standard.

3. The method according to claim 1, wherein the obtained initial pattern of the cell includes a rectangular pattern element.

4. The method according to claim 3, wherein the set cell pattern parameter of the cell pattern includes a line width and a shift amount of the rectangular pattern element.

5. The method according to claim 1,
    wherein calculating includes calculating the evaluation values of the image using a plurality of evaluation indexes, and
    wherein determining includes determining the cell pattern having a cell pattern parameter value when the evaluation value satisfies the predetermined evaluation standard for each of the evaluation indexes.

6. The method according to claim 5, wherein the cell pattern parameter values determined for each of the evaluation indexes are different from each other.

7. The method according to claim 1, wherein the evaluation value includes at least one of a value obtained by adding evaluation values of the images of the patterns of the plurality of cells for the plurality of cells and a minimum value and a maximum value among evaluation values of the images of the patterns of the plurality of cells.

8. A mask pattern generation method, comprising:
obtaining patterns of a plurality of cells from a cell library including the plurality of cells generated by the pattern generation method according to claim 1; and
generating, in a generating step, a mask pattern using the patterns of the plurality of cells to cut or connect line and space patterns.

9. The mask pattern generation method according to claim 8, wherein,
generating in the generating step includes calculating an image of the pattern of the selected cell using a parameter value of the determined exposure condition to obtain an evaluation value of the image by repeatedly changing the parameter value of the mask pattern including a pattern of the cell selected from the cell library, and
generating in the generating step includes determining a parameter value of the mask pattern when the evaluation value satisfies a predetermined evaluation standard.

10. The mask pattern generation method according to claim 8, wherein
generating in the generating step includes calculating an image of the pattern of the selected cell to obtain an evaluation value of the image by repeatedly changing a parameter value of the mask pattern including the pattern of the cell selected from the cell library and a parameter value of the exposure condition in a range different from the determined parameter value of the exposure condition by a predetermined amount, and
generating in the generating step includes determining a parameter value of the mask pattern when the evaluation value satisfies a predetermined evaluation standard.

11. A non-transitory computer-readable storage medium storing a program to cause a computer to execute a method for generating a pattern of a cell in a cell library used for a mask manufacturing method for manufacturing the mask, the method comprising:
obtaining initial patterns of a plurality of cells as a cell pattern;
setting, as set parameter values, a cell pattern parameter value of the cell pattern and an exposure condition parameter value when the cell pattern is illuminated to project image of the pattern of the cell onto a substrate to expose the substrate;
calculating, via a computer, images of the plurality of cells having the set cell pattern parameter value on an image plane of a projection optical system under a exposure condition having the set exposure condition parameter value when the plurality of cells are arranged on an object plane of the projection optical system so that the plurality of cells are separated from each other with a distance in which an optical proximity effect is not exerted on each other;
obtaining an evaluation value of the calculated images;
changing the set cell pattern parameter value and the set exposure condition parameter value;
repeating calculating the image and obtaining the evaluation value using the changed parameter values and changing the set parameter values;
determining, as the patterns of the plurality of cells configured to be used in generating the pattern of the mask, a cell pattern having a cell pattern parameter value when the evaluation value obtained by the repeating satisfies a predetermined evaluation standard; and
storing the determined patterns of the plurality of cells in the cell library,
wherein the mask manufacturing method comprises:
obtaining the determined pattern of the cell from the cell library,
generating a mask pattern using the obtained patterns of the plurality of cells, and
manufacturing the mask including the generated mask pattern using data of the generated mask pattern.

12. An information processing apparatus configured to perform a method for generating a pattern of a cell in a cell library used for a mask manufacturing method for manufacturing the mask, the method comprising:
obtaining initial patterns of a plurality of cells as a cell pattern;
setting, as set parameter values, a cell pattern parameter value of the cell pattern and an exposure condition parameter value when the cell pattern is illuminated to project image of the pattern of the cell onto a substrate to expose the substrate;
calculating, via a computer, images of the plurality of cells having the set cell pattern parameter value on an image plane of a projection optical system under a exposure condition having the set exposure condition parameter value when the plurality of cells are arranged on an object plane of the projection optical system so that the plurality of cells are separated from each other with a distance in which an optical proximity effect is not exerted on each other;
obtaining an evaluation value of the calculated images;
changing the set cell pattern parameter value and the set exposure condition parameter value;
repeating calculating the image and obtaining the evaluation value using the changed parameter values and changing the set parameter values;
determining, as the patterns of the plurality of cells configured to be used in generating the pattern of the mask, a cell pattern having a cell pattern parameter value when the evaluation value obtained by the repeating satisfies a predetermined evaluation standard; and
storing the determined patterns of the plurality of cells in the cell library,
wherein the mask manufacturing method comprises:
obtaining the determined pattern of the cell from the cell library,
generating a mask pattern using the obtained patterns of the plurality of cells, and
manufacturing the mask including the generated mask pattern using data of the generated mask pattern.

13. A device manufacturing method comprising exposing a substrate using an exposure apparatus, and developing the exposed substrate, wherein the exposure apparatus exposes a pattern, formed on a mask, onto a substrate, and the pattern of the mask is generated by a method for generating a pattern of a cell in a cell library used for a mask manufacturing method for manufacturing the mask, the method comprising:
obtaining initial patterns of a plurality of cells as a cell pattern;
setting, as set parameter values, a cell pattern parameter value of the cell pattern and an exposure condition parameter value when the cell pattern is illuminated to project image of the pattern of the cell onto a substrate to expose the substrate;
calculating, via a computer, images of the plurality of cells having the set cell pattern parameter value on an image plane of a projection optical system under a exposure condition having the set exposure condition parameter value when the plurality of cells are arranged on an object plane of the projection optical system so that the plurality of cells are separated from each other with a distance in which an optical proximity effect is not exerted on each other;

obtaining an evaluation value of the calculated images;

changing the set cell pattern parameter value and the set exposure condition parameter value;

repeating calculating the image and obtaining the evaluation value using the changed parameter values and changing the set parameter values;

determining, as the patterns of the plurality of cells configured to be used in generating the pattern of the mask, a cell pattern having a cell pattern parameter value when the evaluation value obtained by the repeating satisfies a predetermined evaluation standard; and storing the determined patterns of the plurality of cells in the cell library, wherein the mask manufacturing method comprises:

obtaining the determined pattern of the cell from the cell library, generating a mask pattern using the obtained patterns of the plurality of cells, and manufacturing the mask including the generated mask pattern using data of the generated mask pattern.

* * * * *